(12) United States Patent
Kakoschke et al.

(10) Patent No.: US 8,288,813 B2
(45) Date of Patent: Oct. 16, 2012

(54) INTEGRATED MEMORY DEVICE HAVING COLUMNS HAVING MULTIPLE BIT LINES

(75) Inventors: Ronald Kakoschke, Munich (DE); Thomas Nirschl, Loiching (DE); Danny Shum, Poughkeepsie, NY (US); Klaus Schrüfer, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 10/918,335

(22) Filed: Aug. 13, 2004

(65) Prior Publication Data

US 2006/0033145 A1    Feb. 16, 2006

(51) Int. Cl.
*H01L 29/788* (2006.01)

(52) U.S. Cl. ........................ 257/315; 257/314

(58) Field of Classification Search ................ 257/314, 257/315, 316
See application file for complete search history.

(56) References Cited

U.S. PATENT DOCUMENTS

| | | | |
|---|---|---|---|
| 5,420,060 A | 5/1995 | Gill et al. | |
| 5,541,875 A | 7/1996 | Liu et al. | |
| 5,574,685 A | 11/1996 | Hsu | |
| 5,759,896 A * | 6/1998 | Hsu | 438/264 |
| 5,882,970 A * | 3/1999 | Lin et al. | 438/264 |
| 5,936,265 A | 8/1999 | Koga | |
| 6,143,607 A | 11/2000 | Chi | |
| 6,181,601 B1 | 1/2001 | Chi | |
| 6,424,000 B1 | 7/2002 | Mehta | |
| 6,577,021 B2 * | 6/2003 | Morishima et al. | 257/213 |
| 6,862,216 B1 | 3/2005 | Hopper et al. | |
| 2003/0075773 A1 | 4/2003 | Deml et al. | |
| 2003/0111672 A1 | 6/2003 | Cavins et al. | |
| 2003/0139011 A1 | 7/2003 | Cleeves et al. | |
| 2005/0104118 A1 | 5/2005 | Diorio et al. | |

FOREIGN PATENT DOCUMENTS

| | | |
|---|---|---|
| DE | 199 43 390 A1 | 5/2001 |
| JP | 61094372 A | 5/1986 |
| JP | 03-280573 | 12/1991 |
| JP | 06-326323 | 11/1994 |
| JP | 08-51193 | 2/1996 |
| JP | 08-78552 | 3/1996 |
| JP | 10-092954 | 4/1998 |
| JP | 11-054742 | 2/1999 |
| JP | 11054742 A | 2/1999 |
| JP | 11-191616 | 7/1999 |
| JP | 2004-507887 | 3/2004 |
| WO | WO 02/15190 A2 | 2/2002 |
| WO | WO 04/001801 A2 | 12/2003 |
| WO | WO 2004/001801 A2 | 12/2003 |

OTHER PUBLICATIONS

Examination Report from corresponding Great Britain Application No. GB0513538.9.

(Continued)

*Primary Examiner* — Ori Nadav

(57) ABSTRACT

A memory device using tunneling field effect transistors (TFET) and buried bit lines is presented. The memory device includes a matrix containing rows and columns of storage cells. Each storage cell contains at least one cell transistor, which in turn contains first doped regions and second doped regions, one of which is a source and the other a drain. The memory device includes word lines, each of which is connected to storage cells of one row and bit lines, each of which is connected to storage cells of one column. The first doped regions are of a different doping type than the second doped regions.

12 Claims, 4 Drawing Sheets

OTHER PUBLICATIONS

Japanese Office Action dated Jun. 2, 2009, for corresponding Japanese Patent Application No. 2005-198146.
Japanese Office Action dated Jan. 28, 2010, for corresponding Japanese Patent Application No. 2005-198146.
German Office Action dated Oct. 25, 2006.
Non-certified English translation of the German Office Action dated Oct. 25, 2006.
German Office Action (and English translation) for related application dated Feb. 24, 2011.

* cited by examiner

INTEGRATED MEMORY DEVICE HAVING COLUMNS HAVING MULTIPLE BIT LINES

BACKGROUND

As electronics become smaller and more sophisticated, devices using smaller and smaller architectures have become more desirable. In particular, research into the shrinkage of various types of memory devices is continuously being undertaken. However, certain problems exist with current technologies. Some of these problems include the non-scalability of tunnel oxides, short channel effects, and other voltage threshold variations. Scaling may result in a decrease of the charge retention time, a decrease of the coupling ratio, or increased leakage between cells in the same column. In addition, complicated design schemes to shrink the memory architecture also increase the manufacturing difficulty and cost.

SUMMARY

By way of introduction only, a memory device is described that can be manufactured easily and that allows shrinkage of the cell size. Additionally, a process for manufacturing such a device is described.

The memory device contains a plurality of storage cells arranged in a matrix. The matrix contains rows of storage cells and columns of storage cells. Each storage cell may contain one or more cell transistors. Each cell transistor contains first doped regions and second doped regions, the first doped region is a drain region and the second region is a source region or alternatively the first doped region is a source region and the second region is a drain region. The memory also contains a plurality of word lines and a plurality of first bit lines. Each word line is connected to storage cells of one row of this matrix. Each first bit line is connected to storage cells of one column of the matrix.

The memory device includes at least one cell transistor that has a source region and a drain region with different doping types from each other. Thus, this transistor may be characterized as a tunneling field effect transistor (TFET) in which the tunneling takes place through a pn-junction that is formed between a channel and one of the source/drain regions. The channel is an inversion channel, which is formed in the intrinsic region of a p-i-n region (p-doped, intrinsic, n-doped) of the transistor. Instead of the intrinsic region, a lightly p-doped or a lightly n-doped region can be used compared with the doping concentration in the source/drain regions. The source/drain regions couple external voltages and are therefore different from halos or pockets near the channel of the transistor. The tunneling current can be influenced by the gate of the transistor, especially by the floating gate of a floating gate transistor.

In one embodiment, only a select transistor or only a storage transistor of a memory cell is a TFET, whereas other transistors of the storage cell are FETs with the same doping type in the source region and in the drain region. Alternatively, all transistors of a memory cell are TFET's.

According to one embodiment, a storage cell only contains one TFET in a flash memory cell. This single transistor flash memory cell is further shrinkable without the problems known for FET's with source/drain regions of the same doping type.

The first regions and the second regions are semiconductor regions, such as single crystalline regions. Silicon or other elemental or compound semiconductor materials may be used in the semiconductor regions. The first regions may be n-doped regions while the second regions are p-doped regions.

According to one embodiment, the memory device contains a plurality of second bit lines. Each second bit line is connected to the second doped regions of the cell transistors of one column. Two bit lines are used in memory devices such as SRAMs and in electrically erasable programmable read only memories (EEPROMs), while in DRAMS only one bit line is used.

According to another embodiment, the first bit lines are raised bit lines that are raised above the storage cells and the second bit lines are buried bit lines which are located beneath the storage cells. In this embodiment, the cell size is smaller than with bit lines arranged laterally to each other.

According to a further embodiment, the first doped regions contain lightly doped regions and heavily doped regions and the second doped regions only contain heavily doped regions. So it is possible to have a small doping concentration gradient on one side of the transistor, for example, on the side with the higher voltage. At the same time, it is possible to reduce the size of the second doped region by omitting the lightly doped regions on the other side of the transistor.

According to different embodiments, either the first and second doped regions are silicided or only the first doped regions are silicided. In the former case, no measures are necessary to prevent silicidation on the second doped region. In the latter case, no semiconductor material is needed for silicidation of the second doped regions. Therefore, a low connection resistance is possible for the second doped regions.

According to another embodiment, each storage cell contains one memory cell transistor. Each first bit line is connected to the first doped region of the cell transistors of one column. Each second bit line is connected to the second doped region of the cell transistors of one column. Memory devices with only one transistor per storage cell have the smallest cell size compared with cells that have two or more transistors. Furthermore, the two bit lines allow control modes with a low failure rate and a high speed.

In a further embodiment, the buried bit line is an insulated doped well, containing also body regions, source regions and drain regions of storage cells of one column. The combination of a TFET and a buried bit line allows formation of a good electrical connection between the buried bit line well and the source areas. Since the well and the doped region connected with the help of the well have the same doping types, no additional measures are necessary to form a good electrical connection, i.e. a connection with low ohmic resistance. The doping concentration in the buried bit line provides good conductivity. The maximum doping concentration of the buried bit line may be at least one order of magnitude lower than the maximum of the source region to allow the formation of a small inversion channel in the channel region. In a further embodiment, the doping type of the well is the same like the doping type of the second doped regions, which is, for instance, the source region.

According to yet another embodiment, at least one of the first bit lines or one of the second bit lines are bit lines buried below the storage cells. If both bit lines are buried, no metal bit lines are necessary. If only one buried bit line is used, the pitch between columns is small and the cross-section of the bit lines can be made larger than in the case with two buried bit lines, assuming that the same lateral area is occupied.

In another embodiment, a common second region is common to storage cells that are adjacent to each other in a column. A first distance between the floating gates of these transistors is smaller than a second distance between floating gates of transistors that are adjacent to a common first region in the same column. The first distance may be equal to the minimum structure width in the memory device, which is possible because additional measures for the electrical connection of the second doped region to the buried bit line need not be used. It is sufficient to implant a heavily doped strap in the buried bit line well. The strap has the same doping type as the well. Therefore, silicided areas with overlap to other regions are not necessary.

In addition, a process for fabricating a memory device in a semiconductor substrate is presented. The memory device comprises a memory array with a plurality of memory cell transistors in which the transistors are arranged in rows and columns. The process may be used for the fabrication of the memory device described herein.

This summary is presented by way of introduction only. The invention, which is defined by the following claims, should be considered together with the following detailed description of the invention.

DETAILED DESCRIPTION OF THE DRAWINGS AND EMBODIMENTS

Although, a Flash Electrically Erasable Programmable Read Only Memory (Flash-EEPROM) is described herein, the memory device may be a DRAM (Dynamic Random Access Memory), a SRAM (Static Random Access Memory), an EEPROM with selective erasing, an EPROM, a ROM (Read Only Memory) or another memory device (e.g. FeRAM-ferroelectric RAM, MRAM-magneto resistive RAM). Each cell may contain only one transistor, such as a floating gate transistor in the case of an EEPROM or a Flash-EEPROM, or may contain multiple transistors.

Figure 1:
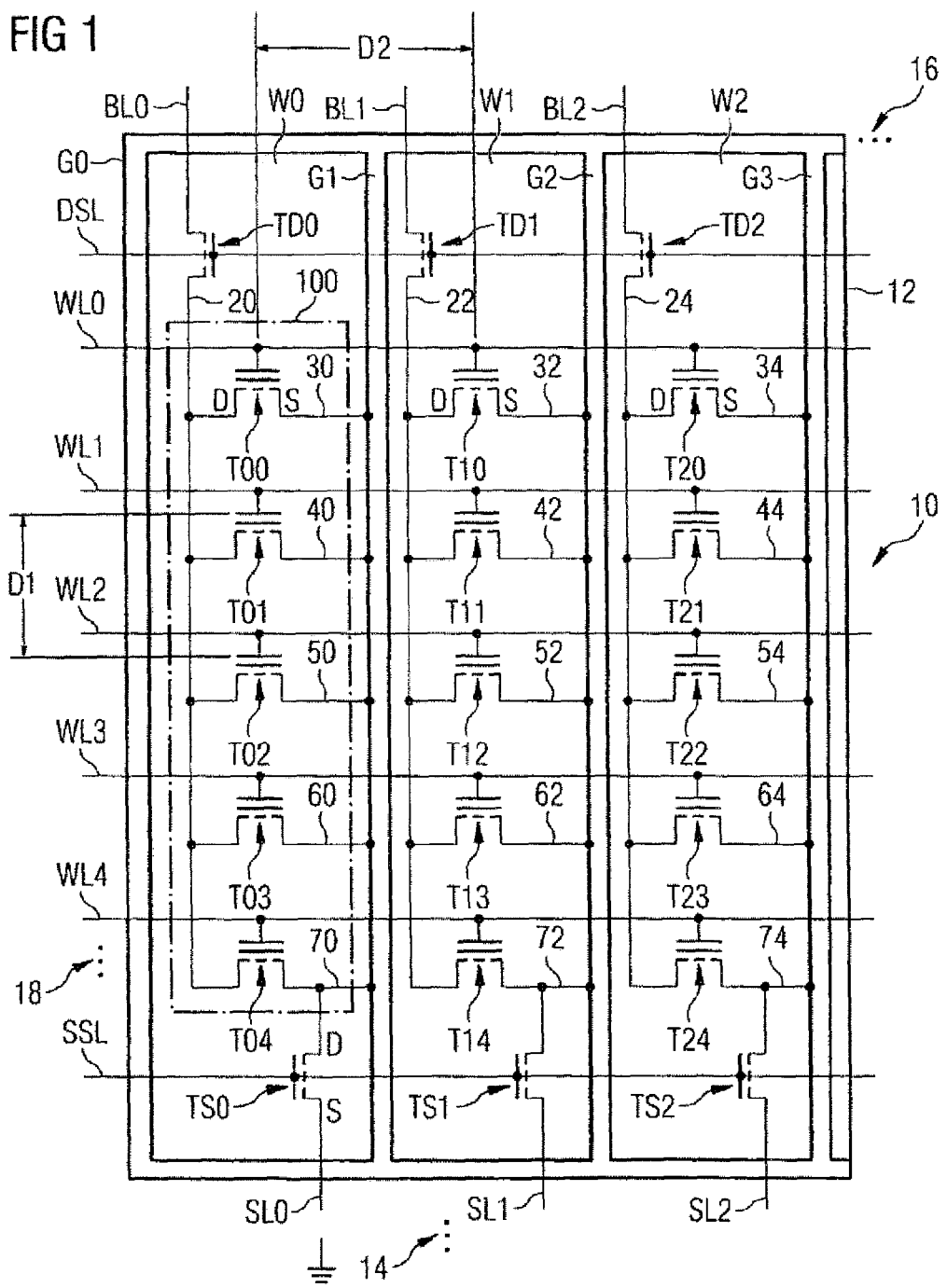
FIG. 1 is a partial electrical schematic of a memory cell area in a Flash-EEPROM.

FIG. 1 is a partial electrical schematic of an integrated memory device 10 containing a plurality of memory segment areas 12, 14. The memory segment areas 12, 14 are fabricated in the same way. Therefore, only the structure of the memory segment area 12 is described in detail below. The memory device contains a plurality of global bit lines BL0 to BLm of which three global bit lines BL0, BL1 and BL2 are shown in FIG. 1. Further global bit lines 16 are shown by dots.

The memory cell area 12 contains a row of drain select transistors TD0 to TDm of which three drain select transistors TD0, TD1 and TD2 are shown in FIG. 1. The gates of the drain select transistors TD0, TD1 and TD2 are electrically connected with a drain select line DSL that is arranged in the row direction.

Furthermore, the memory segment area 12 contains a plurality of memory cell transistors T01 to Tmn of which fifteen memory cell transistors T00 to T24 are shown in FIG. 1. The first index sign m relates to the column in which the memory cell transistor is arranged. The second index sign n relates to the row in which the memory cell transistor is arranged. For example, the memory cell transistor T12 is arranged in the column with the index 1 (here, the second column because counting starts with 0) and in the row with the index 2 (here, the third row because counting starts with 0).

The gate electrodes of the memory cell transistors of each row of the memory segment area 12 are connected to a word line WL0 to WLn respectively. In FIG. 1, five word lines WL0 to WL4 are shown. Further word lines 18 are shown by dots.

The memory cell transistors T00 to T24 are floating gate transistors. Electrical charges are stored in the floating gate, which is electrically insulated. The floating gate may be electrically conductive or electrically insulating.

The memory segment area 12 contains source select transistors TS0 to TSn of which three source select transistors TS0 to TS2 are shown in FIG. 1. The gate electrodes of the source select transistors TS0 to TS2 are electrically connected by a source select line SSL.

The memory segment area 12 also contains electrically insulating wells W0 to Wm of which three insulating wells W0 to W2 are shown in FIG. 1. The insulating wells W0 to Wm are bordered by electrically insulating trenches G0 to G(m+1) of which four insulating trenches G0 to G3 are shown in FIG. 1. The insulating trench G1, for instance, is arranged between the insulating well W0 and the insulating well W1.

In each insulating well W0 to W2, there are situated memory cell transistors of one column, one drain select transistor and one source select transistor. The drain select transistors and the source select transistors are used for the selection of the memory cell transistors. The insulation well W0, for instance, contains the drain select transistor TD0, the memory cell transistors T00 to T04 and the source select transistor TS0. The arrangement of the transistors in each insulating well W0 to Wm is the same. Therefore, only the arrangement of the transistors in the insulating well W0 is explained below.

The drain electrode of the drain select transistor TD0 is electrically connected to the bit line BL0. The source electrode of the drain select transistor TD0 is connected to the drain electrodes of the memory cell transistors T00 to T04 with the help of a raised drain line 20, which is also called a bit line. The raised drain line 20 is located above the insulating well W0 in the first metal level M1, that is, the raised bit line is formed above the insulating well W0 in processing subsequent to the formation of the insulating well W0. The raised drain line consists of a conductive material such as aluminum, copper, an aluminium alloy or a copper alloy.

The source electrodes of the memory cell transistors T00 to T04 are electrically connected to the insulating well W0 with the help of contact portions 30, 40, 50, 60 and 70 respectively. Therefore the insulating well W0 has the function of a buried source line or a buried bit line that is buried in a single crystalline semiconductor substrate. Thus, opposite the above raised bit line, the buried bit line (insulating well W0) is formed below one or more layers such as the first metal level M1. The distance between the floating gates of T01 and T02 is shown as D1 and the distance between floating gates T01 and T11 is shown as D2.

The source electrode of the drain select transistor TS0 is connected to a global source line SL0 that is also called a global bit line. The global source line SL0 is placed in the metal level M2, above the raised drain line 20. The other insulating wells W1, W2 etc. have global source lines SL1, SL2 etc. respectively.

The use of the local drain lines 20, 22 and 24 allows the formation of mini sectors 100 that contain only the memory cells of a column portion but not of the complete column. Such an arrangement is advantageous with regard to the power consumption of the memory device 10 and with regard to the writing speed, reading speed and erasing speed of the memory cells.

Figure 2:
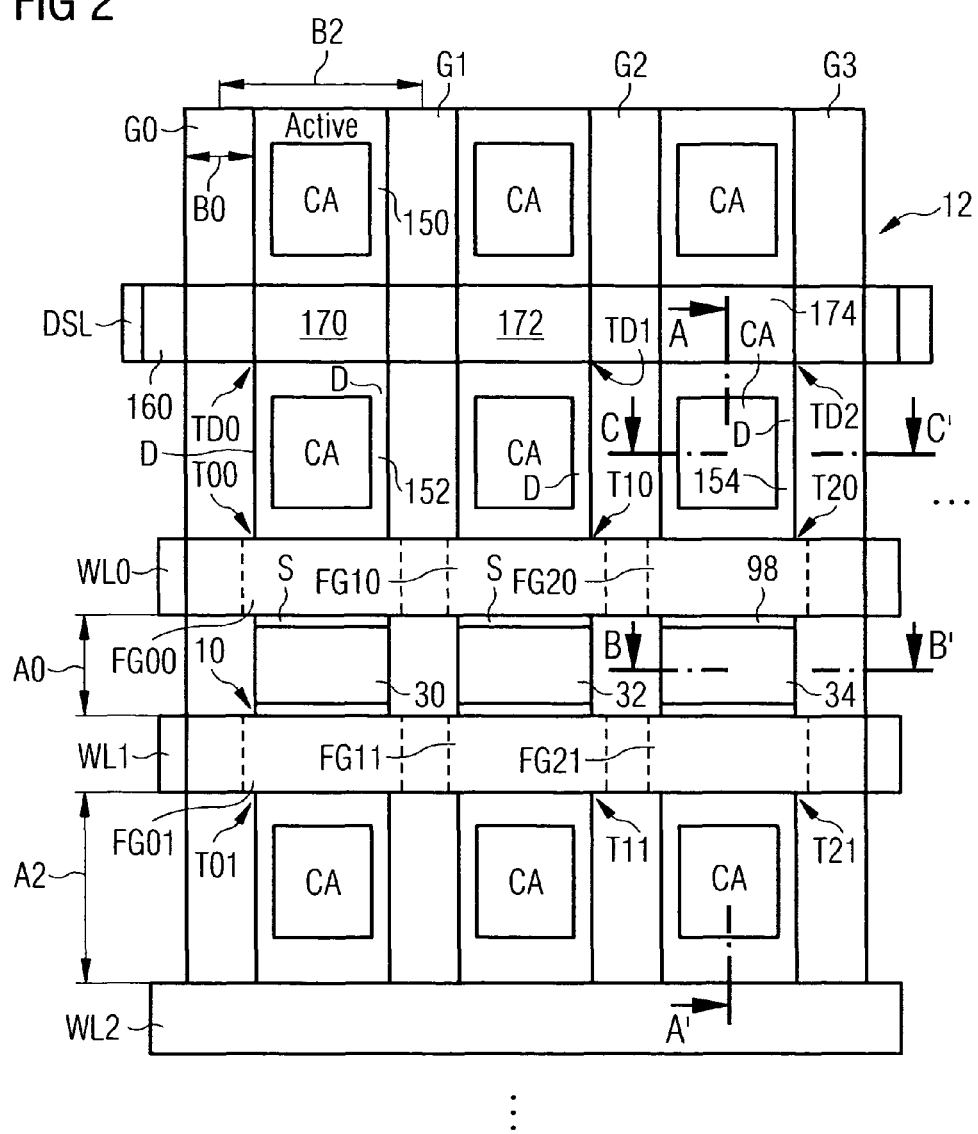
FIG. 2 is a plan view of the memory cell area.

FIG. 2 is a plan view of the memory segment area 12. Note that for convenience, the same reference signs are used for the same parts in all figures. A width B0 of the insulating trenches G0 to G3 is smaller than 150 nm. In one specific example, the width B0 is 100 nm. A distance B2 between the centers of two adjacent insulating trenches is smaller than 300 nm. For example, the distance B2 may be 250 nm. The distance B2 is also called bit line pitch because this is also the distance between adjacent raised drain lines 20, 22 or 24 or between adjacent buried source lines. To enable such a small distance B2 to be fabricated, the drain select transistors TD0 to TD2 and the source select transistors TS0 to TS2 may be multiple gate transistors such as double gate transistors or triple gate transistors. Multiple gate transistors, in one embodiment, contain more than one gate between one or more sources and one or more drains.

In FIG. 2, floating gates FG00 to FG21 of the memory cell transistors T01 to T21 are shown. Contact areas CA to source areas S or to drain areas D of the select transistors are a little bit smaller than the source area S or the drain area D being contacted.

The semiconductor source areas S of the memory cell transistors T00 to T21 have a different doping type than the semiconductor drain areas D of these transistors T00 to T21. Thus, if the source areas S have n-doping type, the drain areas D have p-doping type, and vice versa.

The drain areas D and the source areas S of the memory cell transistors T00 to T21 are produced by two self-aligned implantations after the drain select line DSL, the word lines WL0 to WLm and the source select line SSL have been fabricated. The drain areas D are doped using, for instance, a mask that covers the source areas. Nevertheless, the doping of the drain area is self-aligned to the gate electrodes of the memory cell transistors if the edges of the mask are placed above the gate electrodes, for instance, with the edges along a center line on the top surface of the gate electrodes.

The drain select transistor TD0 has, for instance, both an n-type drain area 150 and an n-type source area 152 that is also the drain electrode of the memory cell transistor T00, i.e. they are of the same doping type. The drain electrodes of the memory cell transistors T00 to T21 are also n-type (for instance, drain electrode 154 of the memory cell transistor T20) but the source areas of the memory cell transistors T00 to T21 are p-type (for instance, the source electrode 98 of the memory cell transistor T20). Therefore, the memory cell transistors T00 to T21 are tunneling transistors which permit not only erasing and writing, but also reading. In the reading mode, a tunneling current flows through a tunnel junction between an inversion channel and the source region. The tunnelling current in this junction is influenced by the charge stored in the floating gate. Therefore, sensing of the charge state of the floating gate is possible.

Above the drain select line DSL, an optional line 160 is arranged which is electrically separated from the drain select line 160 by an insulating layer. The drain select line DSL contains control gates 170, 172, 174 etc. to the drain select transistors TD0 to TD2 respectively.

FIG. 2 also shows three cross-sections. Cross-section A-A' is in the column direction and intersects the center line of the insulating well W2. Cross-section B-B' is in the row direction and intersects the contact portion 34 of the memory cell transistor T20. Cross-section C-C' is also in the row direction and intersects the drain region 154 of the memory cell transistor T20. All three cross-sections A-A', B-B' and C-C' are in a plane parallel to the normal direction of the surface of the semiconductor substrate used to produce the memory device 10.

Furthermore, a distance A0 between floating gates that are adjacent to one another in the column direction and that are adjacent to the same source region is the minimum structure width in the memory device 10. For example, the width is 100 nm for a 130 nm technology (i.e. a technology using a wavelength of 130 nm to expose photoresist used during fabrication) or the width is 70 nm for a 90 nm technology. Alternatively, the distance A0 is smaller than the minimum structure width plus a clearance distance of say ten percent of the minimum structure width. A distance A2 between floating gates that are adjacent to one another in the column direction and that are adjacent to the same drain region is greater than the minimum structure width plus ten percent of that width, in particular, the distance A2 is greater than the distance A0. The distance A0 can be made smaller than the distance A2 because no lightly doped drain (LDD) regions are necessary for the source regions of the memory cell transistors T00 to T24. The LDD regions can be omitted as no overlap of the LDD regions by silicide is necessary. Nor does the silicide have to overlap the buried strap to make electrical contact to the buried strap. The straps are contacted by the p-well, i.e. the buried bit line. Furthermore, the distance A2 is small as no contact area is needed to this source region. The reason for the small distance A0 will be explained in more detail below in connection with FIG. 3.

Figure 3:
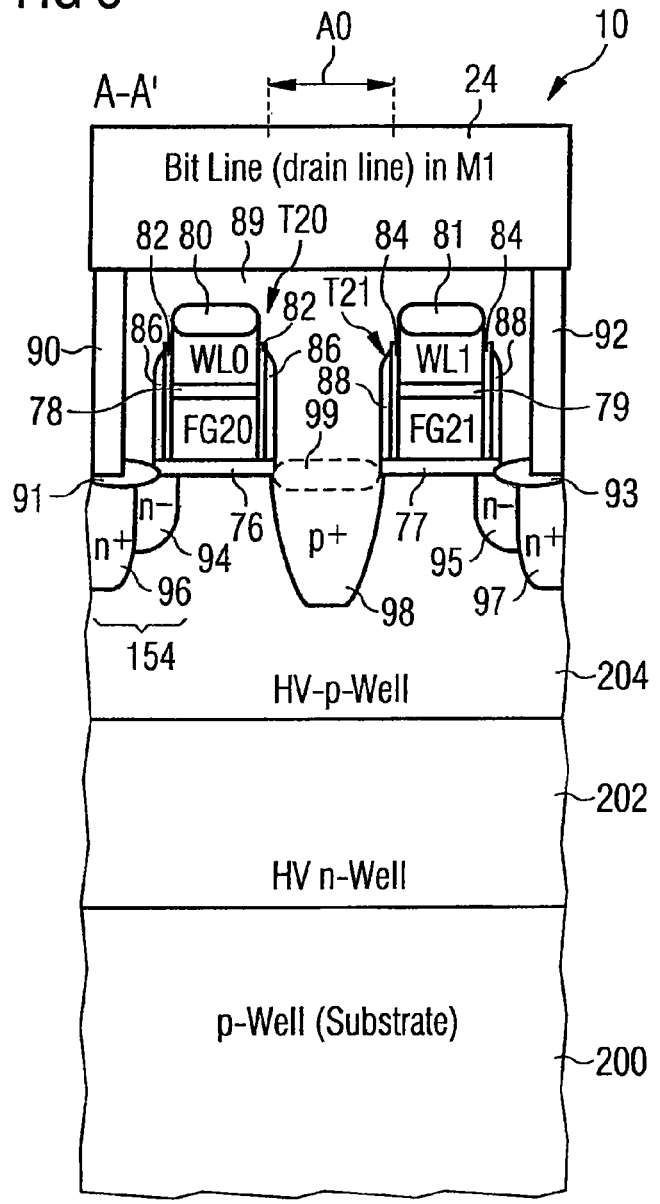
FIG. 3 is a cross-section view taken along the line A-A' of FIG. 2.

FIG. 3 is a cross-section view taken along the line A-A' of FIG. 2. The memory device 10 is arranged in and on a single crystalline semiconductor substrate 200 that consists of lightly p-doped silicon, for example.

In the silicon substrate 200, an n-doped layer 202 and a p-doped layer 204 are produced by a doping technique such as implantation. The n-doped layer 202 is deeper in the substrate 200 than the p-doped layer 204. The n-doped layer 202 is arranged between the substrate 200 p-region and the p-doped layer 204. In the neighborhood of the cross-section A-A', the layers 202 and 204 form the insulating well W2 because they are bordered by the insulating trenches G2 and G3 that are not shown in FIG. 3 but are arranged in front of and behind the cross-section A-A'.

In the embodiment, the doping concentration in the substrate 200 is $10^{15}$ doping atoms per cubic centimeter ($10^{15}$ $cm^{-3}$). The maximum doping concentration of the n-doped layer 202 is greater than $10^{16}$ $cm^{-3}$ but smaller than $10^{20}$ $cm^{-3}$. The maximum doping concentration of the p-doped layer 202 is in a range from $10^{16}$ $cm^{-3}$ to $10^{18}$ $cm^{-3}$.

As shown in FIG. 3, the gate stack of the memory cell transistors T20 and T21 contains in the following order with increasing distance from the substrate 200: 1) A floating gate dielectric 76, 77 such as an oxide or a nitrided oxide having a thickness of 9 nm, 2) The floating gate FG20, FG21 consisting of polycrystalline silicon having a thickness of 100 nm, 3) A control gate dielectric 78, 79 such as an ONO dielectric formed of a stack with three layers, namely an oxide layer, a nitride layer or an oxynitride layer and an oxide layer. The thickness of the ONO layer is 10 nm. 4) A control gate that is formed of a portion of a word line WL0, WL1, made of polycrystalline silicon having a thickness of 100 nm, and 5) A silicided region 80, 81 consisting of a metal silicon compound such as cobalt silicide on top of the gate stack.

The sidewalls of the floating gate FG20, FG21 of the control gate dielectric 78, 79 and of the control gate (word line WL0, WL1) are covered with a dielectric 82, 84 such as a thermal oxide. Sidewall spacers 86, 88 consisting of oxide or nitride, for example, are arranged adjacent to the dielectric 82, 84. The sidewall spacers are single or double spacers. Double sidewall spacers are preferably used for the formation of LDD and HDD doping regions that are explained in more detail below. Single spacers are used if only HDD regions are used.

The gate stacks of the memory cell transistors T20 and T21, the sidewall dielectrics 82, 84 and the sidewall spacers 86, 88 are surrounded by a dielectric layer 89 such as a silicon oxide layer, a TEOS (Tetra Ethyl Ortho Silicate) layer or a silicate glass layer, like a BPSG (Boron Phosphorous Silicate Glass) layer. Alternatively, a low k dielectric layer 89 may be used.

The dielectric layer 89 also contains the metal M1 and therefore also the raised drain line 24. A metal contact 90 is located in a contact hole that goes through the dielectric layer 89 from the drain line 24 to a silicided region 91 on the top surface of the drain region 154 of the transistor T20. A metal contact 92 is located between the drain line 24 and a silicided region 93 on the top surface of the drain region of the transistor T21.

The drain regions D of the memory cell transistors T20, T21 contain n-doped LDD regions 94, 95 and n-doped HDD regions 96, 97. The maximum doping concentration in regions are, for example: in the LDD regions 94, 95 greater than or equal to $10^{17}$ cm$^{-3}$ and smaller than $10^{19}$ cm$^{-3}$, while in the HDD regions greater than or equal to $10^{19}$ cm$^{-3}$.

Both memory cell transistors T20 and T21 have a common source region S. In the embodiment, the common source region contains only a heavily p-doped source region 98, which has a maximum doping concentration of greater than or equal to $10^{19}$ cm$^{-3}$. No metal contacts lead to the common source regions S, 98. The source regions are electrically connected with the strip of the layer 204 that lies between adjacent trenches G2, G3. Because no metal contact goes to the source region 98, a silicide area on the top surface of this region 98 is not necessary. Thus, no silicide area is located on the top surface of the source region 98 in a first embodiment. In an alternative embodiment, a silicide region 99 is, nevertheless, located on the top surface of the source region 98 as no further steps are necessary to avoid the formation of a silicide 99 when siliciding other regions, i.e. 80, 81 and 91, 93. A silicided region is advantageous, for example, if the source region contains a heavily doped area and a low doped area.

Figure 4:
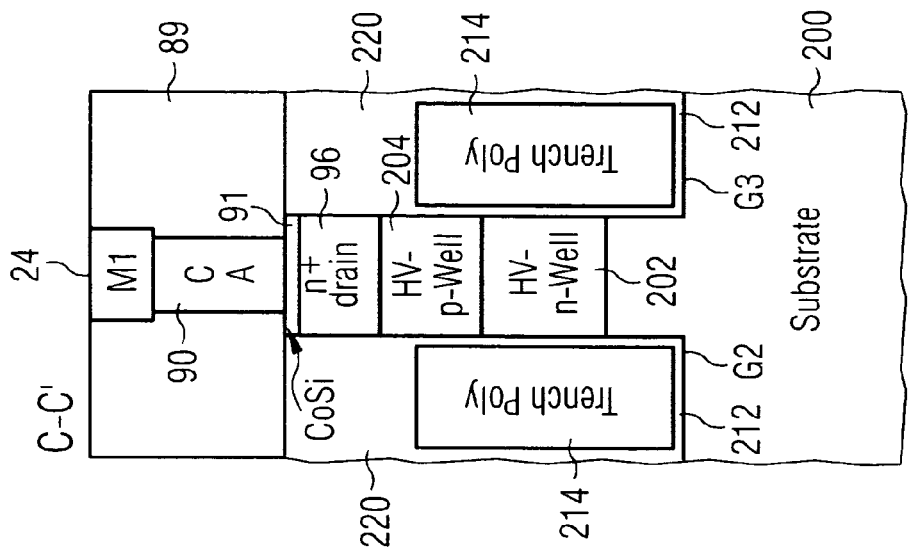
FIG. 4 is a cross-section view taken along the line B-B' of FIG. 2.
Figure 5:
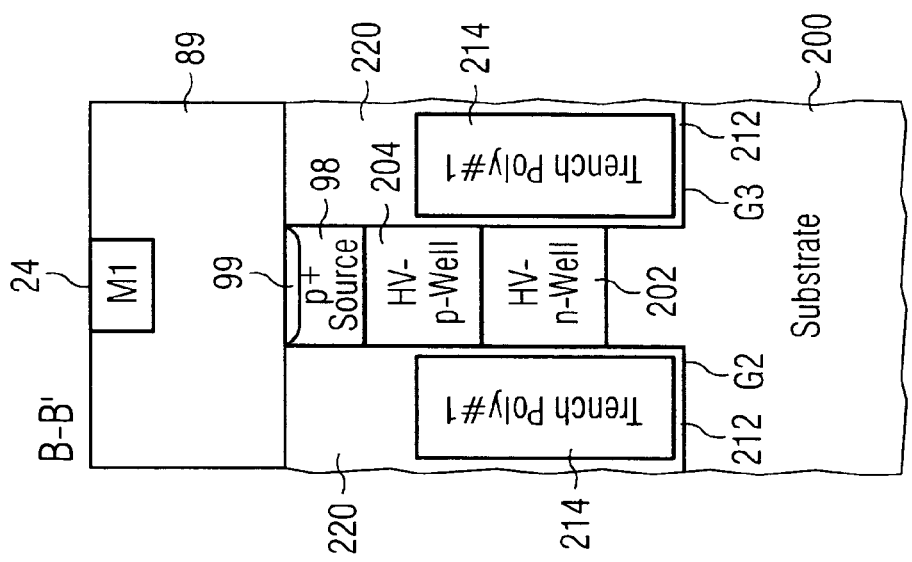
FIG. 5 is a cross-section view taken along the line C-C' of FIG. 2.

FIG. 4 is a cross-section view taken along the line B-B' of FIG. 2. FIG. 5 is a cross-section view taken along the line C-C' of FIG. 2. As shown in FIGS. 4 and 5, the trenches G0 to G3 are electrically insulated against the substrate 200 at the trench bottom and at the trench side walls with a border dielectric 212 such as a border oxide. The border dielectric 212 has a thickness that is small compared to the width of the trenches G0, G1 etc. In one example, the thickness of the border dielectric 212 is only 20 nm, smaller than ⅓ of the trench width. The deeper portions of the trenches G0 to G3 are filled with polycrystalline silicon 214, for instance. In the embodiment shown, approximately ⅔ of each trench G0 to G3 are filled with polysilicon 214. The upper regions of the trenches G0 to G3 are filled with a dielectric material 220 such as silicon oxide. The upper regions can be etched along with shallow trenches in areas outside the memory segment area 12, 14 in the control circuit, word line drivers, bit line drivers or sense amplifiers. The second etching of the upper regions of the trenches and of the shallow trenches at the same time may be performed if an embedded memory device 10 is fabricated that is embedded with a logic circuit such as a processor. In an alternative embodiment, the trenches are filled only with one material or the upper portions of the trenches G0 to G3 are also filled with polysilicon.

In one example, the depth of the trenches G0 to G3 ranges from 0.9 to 1.5 μm, and may be say 1 μm. The trenches G0 to G3 go through the layer 204 and also through the layer 202. In an alternative embodiment, the bottoms of the trenches G0 to G3 are located in the layer 202.

As also shown in FIGS. 4 and 5, the p-doped source region 98 of memory cell transistor T20 ends in the strip of the p-doped layer 204 that forms the buried source line for transistor T20. The n-doped drain region 96 of the memory cell transistor T20 also ends in the strip of the p-doped layer 204 that forms the buried source line.

Turning to the different operation modes, the programming mode, the erasing mode and the reading mode will be explained for the transistor T11. In other examples, voltages of other polarities or of other values are used. In one particular example, voltages that differ from the voltages in the example only in a range of plus 50 percent to minus 50 percent are used. Furthermore, although the potential difference is the same, the splitting of the voltages can be different, for instance +8.5 Volts and −8.5 Volts can be used instead of +14 Volts and −3 Volts. In addition to or instead, the voltage splitting the absolute voltage difference can also be changed for example in a range of plus 50 percent to minus 50 percent.

While programming, the voltages on transistor T11 are: +14 Volts coupled to the control gate electrode, and −3 Volts coupled to the source region, to the body region and to the drain region. Under these conditions, a tunneling current flows from an inversion channel in the body through the whole area of a tunnel dielectric in the floating gate of transistor T11.

While programming, the voltages on transistors of the same row like transistor T11 but in another column than transistor T11 are explained for transistor T21: +14 Volts coupled to the control gate electrode, +3 Volts coupled to the source region, to the body region and to the drain region. Under these conditions, no tunneling current flows to the floating gate in transistor T11 because the voltage difference is too low.

While programming, the voltages on transistors of the same column like transistor T11 but in another row than transistor T11 are explained for transistor T12: 0 Volts or −3 Volts coupled to the control gate electrode, and −3 Volts coupled to the source region, to the body region and to the drain region.

While programming, the voltages on transistors of another row than transistor T11 and in another column than transistor T11 are explained for transistor T22: 0 Volts coupled to the control gate electrode, and +3 Volts coupled to the source region, to the body region and to the drain region.

While erasing, all memory cells of a segment 12, 14 or of a mini-sector 100 are erased at the same time. Alternatively, only the memory cells connected only one single cell is erased without erasing other cells. For erasing all transistors T00 to T24, these transistors have all the same voltages. For instance, the voltages for transistor T11 are: −14 Volts coupled to the control gate, and +3 Volts coupled to the source region, to the drain region and to the body. While erasing, a tunneling current flows in the opposite direction compared with the current flow during the process of programming.

In the reading mode, the following is valid for transistor T11: +2.5 Volts coupled to the gate electrode, 0 Volts coupled to the source region and to the body region, and −1 Volt or 1.2 Volts coupled to the drain region. Under these conditions, the drain current or the threshold voltage of transistor T11 is sensed and amplified.

Other types of EEPROM cells can also be used, for instance, split gate cells or ETOX (EPROM tunnel oxide)

cells. Other programming modes, reading modes or erasing modes are also possible, such as channel hot electron (CHE) programming.

Due to a hard mask such as a TEOS hard mask, on the top surface of the control gates or of the word lines WL0 to WL2, fabrication techniques such as a double implant or counter-doping of the control gates is avoided. This results in a work function which is very well controlled so that only a small threshold voltage variation and a small current variation exists between the cell transistors.

Although conventional flash scaling is approaching its limits, use of the embodiments described herein may permit further shrinkage to 65 nm generation structures and beyond. For cell size scaling, omitting contacts may become increasingly important. For fast access, however, it may be beneficial to use source and drain contacts at each cell including metal connections. Therefore, two bit lines (BL) per memory cell may be desirable for flash memories architectures appropriate for fast access, e.g. the UCP (Uniform Channel Programming) Flash cell. But as a consequence of using these two metal lines, the cell size may be limited in one direction by the pitches between the two metals M1 (or the metal M1 pitches). Additionally, as metal M2 is usually used for BLs and metal M1 for landing pads, the cell size may be limited in the x-direction by the two metal M2 pitches.

Scaling limits for flash cell transistors may also be detrimentally affected because of the non-scalability of the tunnel oxide. For example, short channel effects become more severe than for conventional transistor devices. Low punch-through voltages, Vt variations due to roll off and leakage current, may be major problems in scaling the transistor length. However, using the above embodiments, all of these limiting issues may be overcome.

The use of buried straps in a so-called SNOR architecture permits every source region to be tied to the isolated p-well by a CoSi short (buried straps), the isolated p-wells to replace the metal source lines (i.e. BBL or the buried bit line concept), and the scalability of the BL pitch to no longer be limited by the M2 pitch. In fact, until now the BL pitch was equal to 2*M2 pitch. The embodiments illustrate a simple way to realize electrical contact from the source to the p-well.

By using the embodiments, two contacts per cell and bit lines are avoided and further cell size reduction is possible, no silicide overlap is necessary on the source side and is optional on the drain side for buried bit lines, and further cell transistor shrinkage is possible.

Of course, problems exist when shrinking the size of the memory architecture. These reasons include the short channel effects and oxide thickness scaling. To get better control of the channel, tunnel (gate) oxide scaling is desirable. Scaling, however, may result in a dramatic increase of the moving bit rate and in a decrease of the retention time. Additionally, scaling the tunnel oxide thickness may decrease the coupling ratio. For a short transistor length, the leakage problem aggravates reading of the cell. Leaking cells in the same column contribute to the current of the cell to be read.

The present embodiments save source contact area and thus allow smaller cell size. In addition, a silicide-strap between n+-matrix and p+-well contact is not necessary as there is an inherently good connection between p+ source and p-well. Scaling of tunnel oxide (gate oxide) is not necessary, thus a low moving bit rate and good retention time can be maintained while the coupling ratio remains high. The leakage problem p-i-n junctions, although low even for short channels, is reduced as the intrinsic region is substituted by a lightly doped p-region or n-region. Due to the pin structure of the TFET (Tunnelling Field Effect Transistor) the breakdown and punch through voltage of the device is increased compared to the standard MOSFET (Metal Oxide Semiconductor) or insulated gate FET (IGFET).

Also a reduction of the short channel effect due to higher punch-through voltage is achieved, thereby permitting further channel length scaling. In other words, n+ sources of a NMOS cell transistor are replaced by p+ sources. Therefore, the cell transistor works as a TFET, mitigating or eliminating the need for oxide thickness scaling in transistor scaling. This further enables an easily realizable source to a p-well tie which favors the BBL architecture.

Although the present invention has been explained by the embodiments shown in the drawings and described above, it should be understood to the ordinary skilled person in the art that the invention is not limited to the embodiments, but rather that various changes or modifications thereof are possible without departing from the spirit of the invention. For example, various materials used as well as dimensions, dopings, voltages and other numbers used throughout are representative only. Similarly, fabrication of the embodiments above may be performed using conventional fabrication equipment and techniques. Accordingly, the scope of the invention shall be determined only by the appended claims and their equivalents. Formation of the structures illustrated and described herein using these methods is well within the skill of those of ordinary skill in the art

The invention claimed is:

1. A memory device comprising:
a plurality of storage cells arranged in rows and columns, wherein each storage cell of the plurality of storage cells comprises a tunneling field effect transistor;
wherein each of the tunneling field effect transistors comprises a doped drain region and a doped source region,
wherein the doped drain region is of a different doping type than the doped source region;
each of the tunneling field effect transistors further comprises a floating gate;
a first word line connected to a first row of storage cells;
a first bit line to control a voltage of the doped drain regions of the tunneling field effect transistors of a first column of storage cells; and
a second bit line that controls a voltage of the doped source regions of the tunneling field effect transistors of the first column of storage cells,
wherein the second bit line is an electrically insulating well,
wherein a first tunneling field effect transistor, of the tunneling field effect transistors, of a first storage cell has a first floating gate connected to a control gate of the first word line, a first doped drain region connected to the first bit line, and a first doped source region connected to the second bit line via the electrically insulating well, the first tunneling field effect transistor having a tunneling junction and a tunneling current flowing through the tunneling junction between an inversion channel formed in an intrinsic region of a p-i-n region of the first tunneling field effect transistor and one of the first doped drain region and the first doped source region, and
said first tunneling field effect transistor is immediately adjacent in a column to a second tunneling field effect transistor, and the second tunneling field effect transistor is immediately adjacent in said column to a third tunneling field effect transistor, and
wherein a first distance in said column between the floating gate of the first tunneling field effect transistor and the floating gate of the second tunneling field effect transistor is smaller than a second distance in said column between the floating gate of the second tunneling field effect transistor and the floating gate of the third tunneling field effect transistor, wherein at least two floating gates of the adjacent floating gates in said column are separated by lithographically dependent minimum structure widths plus a clearance distance of approximately 10% of said minimum structure width.

2. The device of claim 1, wherein the first bit line is a raised bit line which is raised above the first column of storage cells and the second bit line is a buried bit line.

3. The device of claim 2, wherein the buried bit line is an insulated doped well containing one of either the doped drain regions within the first column of storage cells or the doped source regions within the first column of storage cells.

4. The device of claim 3, wherein a doping type of the insulated doped well is the same as a doping type of the doped source regions of the first column of storage cells.

5. The device of claim 1, wherein each of the doped drain regions includes a lightly doped region and a heavily doped region, and each of the doped source regions includes only a heavily doped region that is different than the heavily doped region of the doped drain region.

6. The device of claim 1, wherein the doped drain regions and doped source regions are silicided.

7. The device of claim 1, wherein the first doped regions are silicided and the second doped regions are not silicided.

8. The device of claim 1, wherein the first bit line or the second bit line comprises a bit line buried below the plurality of storage cells.

9. The memory device of claim 1 wherein, during a read operation, the inversion channel is formed in an intrinsic region of a p-i-n region of the first tunneling field effect transistor, wherein the p-i-n region is formed by the first doped drain region of the first tunneling field effect transistor, by the intrinsic region and by the first doped source region of the first tunneling field effect transistor, or wherein the inversion channel is formed within a doped layer region formed between the first doped drain region and the first doped source region of the first tunneling field effect transistor.

10. The memory device of claim 9 wherein the doped layer region is lightly doped in comparison to a first doping concentration of the first doped drain region.

11. The memory device of claim 9 wherein the doped layer region is lightly doped in comparison to a second doping concentration of the first doped source region.

12. The memory device of claim 1, further comprising a third bit line parallel to the first bit line that enables control of the voltage of doped source regions of the tunneling field effect transistors of a third column of storage cells, the third column of storage cells being different from the first column of storage cells.

* * * * *